United States Patent
Van Epps et al.

(10) Patent No.: US 7,164,994 B2
(45) Date of Patent: *Jan. 16, 2007

(54) DIFFERENTIAL TERMINATION ATTENUATOR NETWORK FOR A MEASUREMENT PROBE HAVING AN INTERNAL TERMINATION VOLTAGE GENERATOR

(75) Inventors: Richard A. Van Epps, Vancouver, WA (US); Ira G. Pollock, Hillsboro, OR (US); Michael D. Stevens, Hillsboro, OR (US); Dale R. Daniels, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 83 days.

This patent is subject to a terminal disclaimer.

(21) Appl. No.: 11/051,425

(22) Filed: Feb. 4, 2005

(65) Prior Publication Data

US 2006/0176030 A1 Aug. 10, 2006

(51) Int. Cl.
G01R 15/00 (2006.01)
G01R 27/28 (2006.01)
G01R 1/20 (2006.01)
G06F 19/00 (2006.01)
H03L 5/00 (2006.01)
H01P 1/22 (2006.01)
H03H 7/24 (2006.01)

(52) U.S. Cl. .......................... 702/57; 702/64; 702/117; 324/126; 327/308; 333/81 R (58) Field of Classification Search ................ 702/118, 702/57
See application file for complete search history.

(56) References Cited

U.S. PATENT DOCUMENTS

| 4,393,347 A * | 7/1983 | Looper ...................... 324/126 |
| 4,833,418 A * | 5/1989 | Quintus et al. ................ 330/9 |
| 6,629,048 B1 | 9/2003 | Law et al. |
| 2004/0085085 A1* | 5/2004 | Muhtaroglu et al. ........ 324/765 |

* cited by examiner

Primary Examiner—John Barlow
Assistant Examiner—Lisa Sievers
(74) Attorney, Agent, or Firm—William K. Bucher (57) ABSTRACT

A differential termination and attenuator network having an internal common mode termination voltage generator includes first and second termination resistors coupled in parallel with corresponding resistive attenuator circuits. A monitoring circuit coupled to input nodes of the network generates an output signal representative of the combination of a DC common mode voltage on the input nodes and an internal termination voltage. A control circuit generates scaled termination and compensation voltages and associated drive currents using the internal termination voltage and the monitoring circuit output signal. The scaled termination voltage and the scaled compensation voltage operate on the differential termination and attenuation network to optimize the dynamic range of a differential amplifier connected to the first and second attenuator outputs and null the DC currents at the input of the network. The internal termination voltage generator receives termination voltage parameters from a measurement instrument for generating the internal termination voltage.

13 Claims, 7 Drawing Sheets

DIFFERENTIAL TERMINATION ATTENUATOR NETWORK FOR A MEASUREMENT PROBE HAVING AN INTERNAL TERMINATION VOLTAGE GENERATOR

BACKGROUND OF THE INVENTION

The present invention relates generally to differential measurement probes with input signal terminations and more particularly to a differential termination and attenuator network for a measurement probe having an internal termination voltage generator for DC common mode voltage compensation.

High speed measurement systems generally feature a resistive input termination that matches the characteristic impedance of the input signal transmission line. This is done to minimize input signal reflection problems and provide the best signal fidelity. A dual 50 ohm input termination network is the most common topology for high speed differential systems. Although 50 ohm input terminations are usually connected to the measurement system ground, some applications require termination to a common mode DC termination voltage. The availability of an adjustable DC termination voltage in the measurement termination network allows control of the DC loading of the signal source, such as in a high speed serial data signal having a significant DC common mode component.

Figure 1:
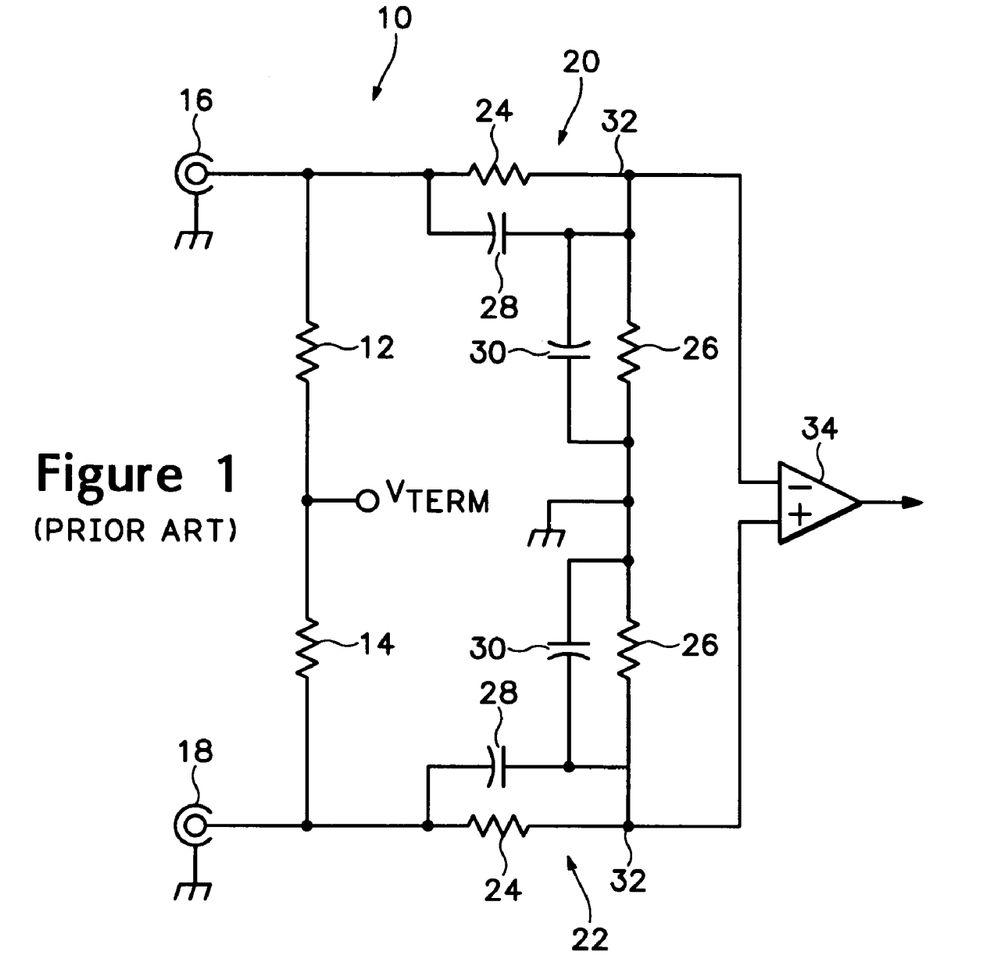
FIG. 1 is a schematic representation of a prior art input differential termination and attenuator network.

FIG. 1 is a schematic representation of a termination network 10 having an adjustable DC termination voltage $V_{TERM}$ used in the P7350SMA Differential Probe, manufactured and sold by Tektronix, Inc. The DC termination voltage $V_{TERM}$ is generated by an external voltage supply source and coupled to the common node of the termination resistors 12 and 14. The termination resistors 12 and 14 are 50 ohm resistors that match a 50 ohm differential source impedance of a device under test. The differential input signal is coupled via SMA input connectors 16 and 18 to the termination resistors 12 and 14 and to the inputs of high impedance attenuators 20 and 22. The opposite ends of the high impedance attenuators 20 and 22 are coupled to ground. Each attenuator 20 and 22 has a resistive voltage divider consisting of resistive elements 24 and 26 coupled in parallel with a compensating capacitive voltage divider consisting of capacitive elements 28 and 30. The intermediate nodes 32 of the resistive/capacitive voltage divider networks are coupled to the inverting and non-inverting inputs of a differential amplifier 34.

The matching of the DC termination voltage $V_{TERM}$ of the measurement probe to the DC common mode component of the input signal allows the input signal to be directly connected to the measurement probe inputs without AC coupling by minimizing the DC loading on the signal source. Since the DC termination voltage $V_{TERM}$ is supplied by an external source, the input DC common mode voltage needs to be measured and the external termination voltage set to match the input DC common mode voltage of the signal source. The high speed differential amplifier 34 generally has a limited input dynamic range. The high impedance input attenuators 20 and 22 are provided to extend the linear dynamic range of the high speed differential amplifier 34. The DC common mode voltage at the attenuators 20 and 22 outputs results from both the common mode component of the input signal and from the common mode termination voltage $V_{TERM}$ of the termination network. A well designed differential measurement amplifier 34 will have a very large common mode rejection ratio, CMRR, which largely eliminates the DC common mode voltage in the amplifier output signal. Any non-zero, DC common mode voltage present at the input of the differential amplifier 34, however, will reduce the effective linear dynamic range of the amplifier 34. A large DC common mode voltage in the input signal can easily overdrive the differential amplifier 34, making it impossible to measure the often small differential mode signal.

What is needed is an input differential termination and attenuation network for a measurement probe that has an internal termination voltage generator for producing a controllable termination voltage. The input differential termination and attenuation network should monitor the input signal and provide a scaled DC termination voltage that can be adjusted to produce zero loading to the input signal source. The input differential termination and attenuation network should also provide a scaled compensation voltage that provides a DC common mode voltage output to the inputs of a differential measurement amplifier for the optimal dynamic range. The internal termination voltage generator should be controllable from a measurement instrument connected to the measurement probe.

SUMMARY OF THE INVENTION

Accordingly, the present invention is a differential termination and attenuator network having an internal common mode termination voltage generator and a termination voltage control circuit receiving a DC common mode voltage from a voltage source having source resistances and coupled to a differential amplifier where the control circuit optimizes the dynamic range of the differential amplifier. The differential termination and attenuator network has first and second input termination resistances having a common node and respective input network nodes receiving the DC common mode voltage from the voltage source. The input network nodes are coupled to respective input nodes of first and second attenuators having a common node. A monitoring circuit is coupled to the input network nodes of the first and second input termination resistances for generating an output signal representative of the combination of a DC common mode voltage on the input source resistances and voltage representative of an internal termination voltage generated by the internal termination voltage generator on the input termination resistances. The monitoring circuit is preferably a resistive voltage divider network having high impedance inputs relative to the first and second input termination resistances. A control circuit receives the internal termination voltage from the internal termination voltage generator and the monitoring circuit output signal and generates a scaled termination voltage and drive current and a scaled compensation voltage and drive current that are a function of the internal termination voltage and the DC common mode voltage. The scaled termination voltage and drive current are coupled to the common node of the first and second input termination resistances and the scaled compensation voltage and drive current are coupled to the common node of the first and second attenuators. The scaled termination voltage and drive current and the scaled compensation voltage and drive current provide DC currents through the input termination resistances and the attenuators for nulling DC currents at the network input nodes and provide a DC common mode voltage output from the first and second attenuators for optimizing the dynamic range of the differential measurement amplifier.

Each input termination resistance is implemented as an input termination resistor coupled in parallel with one of the respective first and second attenuators. The attenuators are implemented with first and second resistors with one side of the first resistor coupled to one of the first and second input termination resistors and the other side coupled to one side of the second resistor at the output node of the attenuator and the other side of the second resistor coupled to receive the scaled compensation voltage at the common node of the first and second attenuators.

The scaled termination and scaled compensation voltages have scaling factors that are a function of the first and second input termination resistors and the first and second resistors of the respective first and second attenuators. The scaled termination voltage has a first scaling factor providing a first voltage proportional to the internal termination voltage and a second scaling factor providing a correction voltage proportional to the difference between the DC common mode voltage on the input network nodes of the first and second input termination resistances and the internal termination voltage. The scaled compensation voltage has a first scaling factor providing a first voltage proportional to the internal termination voltage and a second scaling factor providing a correction voltage proportional to the difference between the DC common mode voltage on the input network nodes of the first and second input termination resistances and the internal termination voltage. In the preferred embodiment of the invention, the scaled compensation voltage produces a substantially zero volts DC common mode voltage across the output nodes of the first and second attenuators.

The control circuit has a correction differential amplifier receiving as inputs the output signal from the monitoring circuit and the internal termination voltage. The correction differential amplifier generates an output signal representative of the difference between the output signal from the monitoring circuit and the internal termination voltage. A first summing node is coupled to receive the internal termination voltage and the output signal from the correction differential amplifier and generates an output signal representative of the internal termination voltage and an attenuated representation of the output signal from the correction differential amplifier. The output signal from the first summing node is coupled to a first drive amplifier having a scaling gain factor for generating the scaled termination voltage. A second summing node is coupled to receive the internal termination voltage and the output signal from the correction differential amplifier and generates an output signal representative of the internal termination voltage and the output signal from the correction differential amplifier. The output signal from the second summing node is coupled to a second drive amplifier having a scaling gain factor for generating the scaled compensation voltage.

In the preferred embodiment of the invention the first summing node has an attenuation circuit receiving the output signal from the correction differential amplifier and a summing amplifier. The summing amplifier has an input node coupled to receive the internal termination voltage and an attenuated representation of the output signal from the correction differential amplifier. The summing amplifier generates the output signal representative of the internal termination voltage and attenuated representation of the output signal from the correction differential amplifier.

The internal common mode termination voltage generator receives termination voltage parameters from an external source and generates an internal termination voltage. In the preferred embodiment of the invention, the termination voltage parameters are provided by a host measurement instrument where the termination voltage parameters are defined using a graphical user interface presented on a display device of the measurement instrument. The termination voltage parameters are coupled to a digital-to-analog converter that converts the termination voltage parameters into an analog internal termination voltage. The preferred embodiment of the internal common mode termination voltage generator has a microcontroller receiving the termination voltage parameters from an external source and generating a digital output representative of the internal termination voltage. The digital output representative of the internal termination voltage from the microcontroller is coupled to a digital-to-analog converter which generates the analog internal termination voltage. A buffer amplifier is coupled to receive the analog internal termination voltage and generate a zero-offset and calibration controlled internal termination voltage.

The objects, advantages and novel features of the present invention are apparent from the following detailed description when read in conjunction with appended claims and attached drawings.

DETAILED DESCRIPTION OF THE PREFERRED EMBODIMENT

Figure 2:
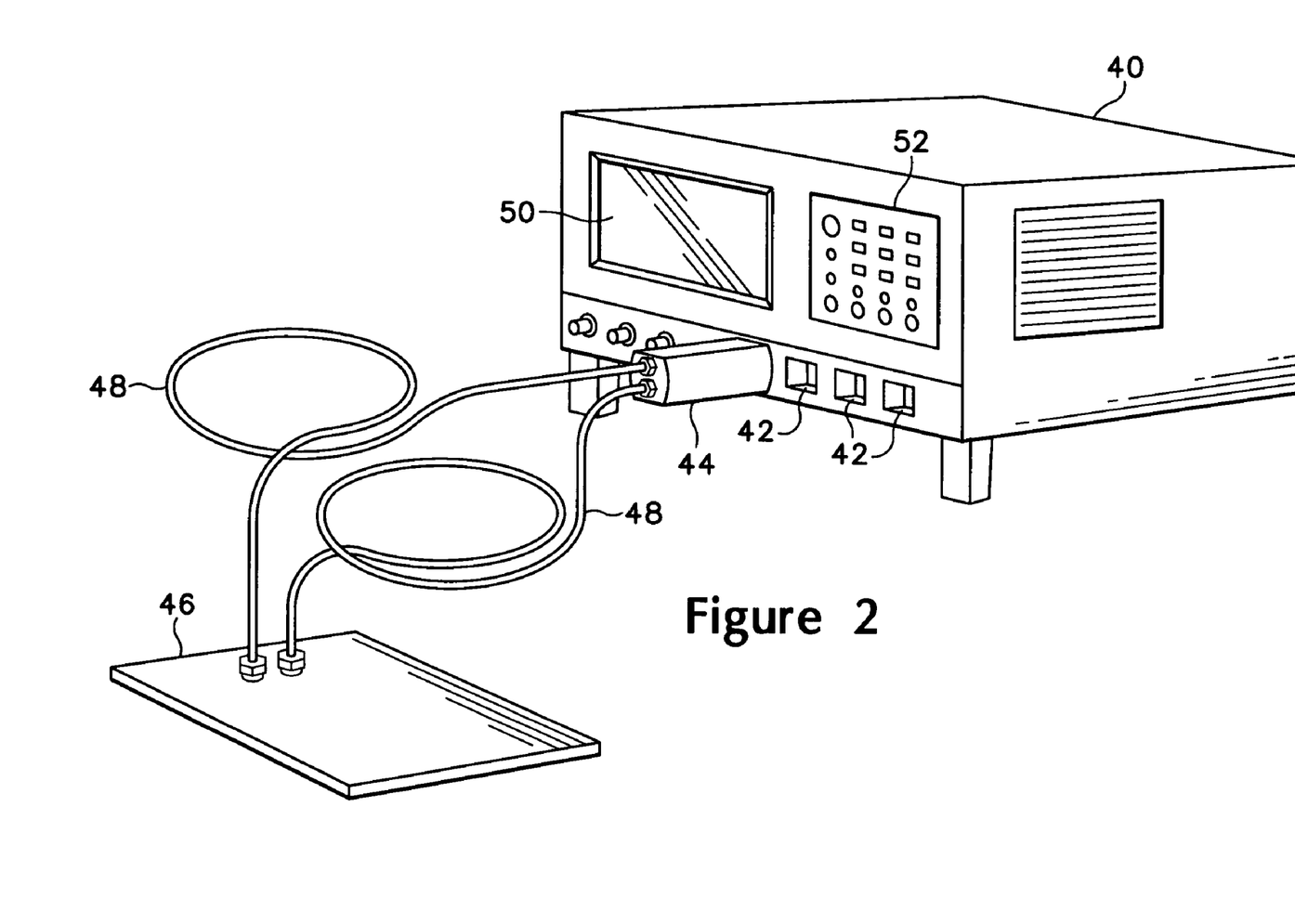
FIG. 2 is a perspective view of a measurement instrument having a measurement probe incorporating the input differential termination and attenuator network having an internal termination voltage generator according to the present invention.

Referring to FIG. 2, there is shown a measurement test instrument 40, such as a TDS6804B oscilloscope manufactured and sold by Tektronix, Inc. The oscilloscope 40 has multiple accessory interfaces 42 for connecting one or more accessory devices 44 to the oscilloscope, such as a differential measurement probe incorporating the input differential termination and attenuator network having an internal termination voltage generator of the present invention. Each accessory interface 42 has a coaxial signal input line and voltage power, clock, data, sensing and memory power lines as described in U.S. Pat. No. 6,629,048 B1, titled "Measurement Test Instrument and Associated Voltage Management System for Accessory Device" and incorporated by reference in its entirety. The accessory interface 42 provides voltage power from the oscilloscope 40 to the measurement probe 44 and bi-directional communications between the oscilloscope 40 and the probe 44. The differential measurement probe 44 is coupled to a device under test 46 via SMA terminated coaxial cables 48. The oscilloscope 40 has a display device 50 on which is displayed a graphical user interface and processed signals from a device under test 46. Generally, the measurement test instrument 40 includes front panel controls 52, such as rotatable knobs, push buttons and the like for controlling the settings of the instrument. Alternatively, the front panel controls may be graphically generated and displayed on the display device 50 and controllable by the user.

Figure 3:
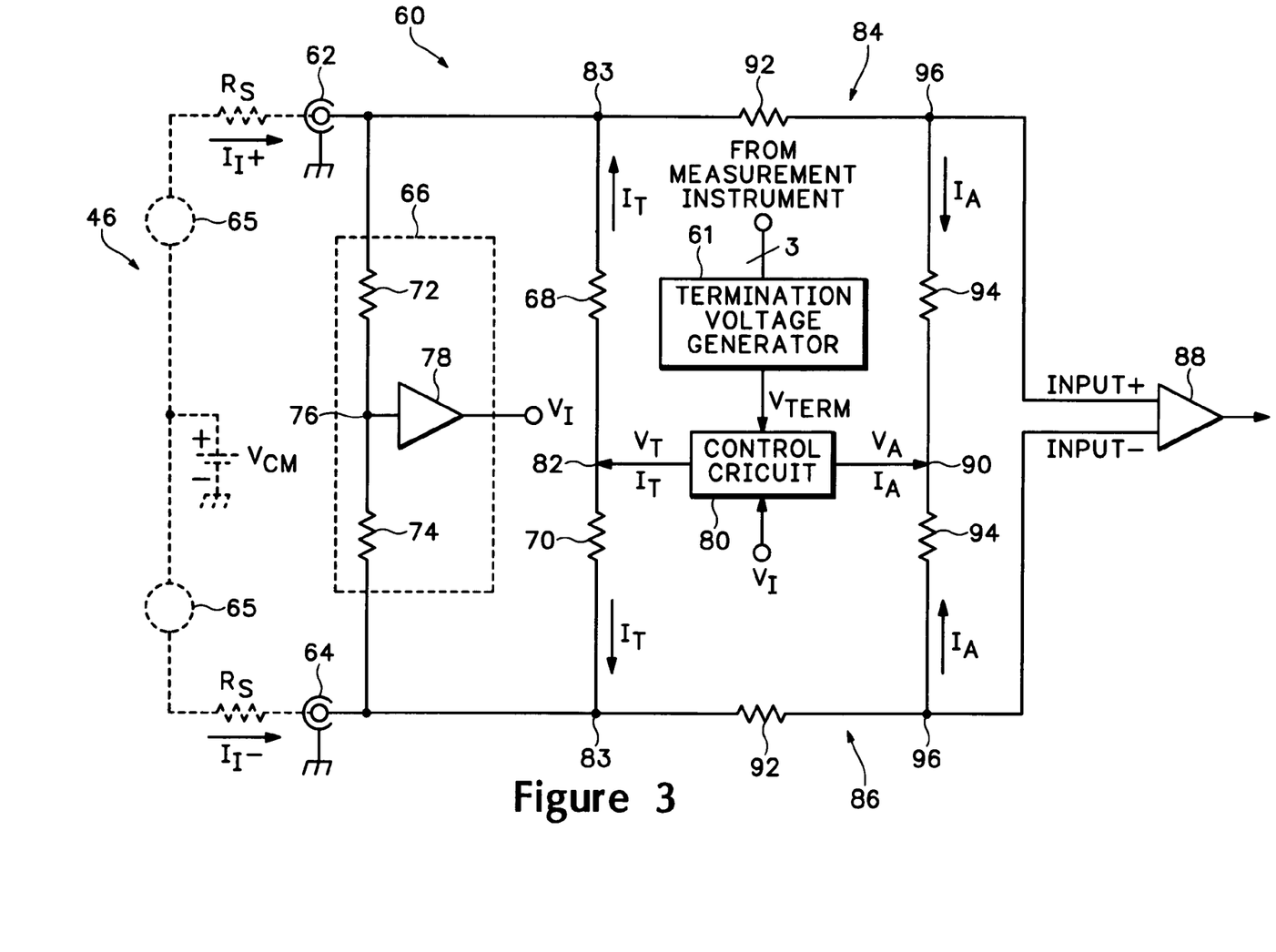
FIG. 3 is a representative block diagram of the input differential termination and attenuator network having an internal termination voltage generator according to the present invention.

Referring to FIG. 3, there is-shown a schematic block diagram of the input differential termination and attenuation network 60 having an internal common mode termination voltage generator 61 incorporated into the differential measurement probe 44. The input differential termination and attenuation network 60 receives differential input signals, IN+, IN−, from the device under test 46 at inputs 62 and 64. The device under test 46 may be modeled as a DC common mode signal source, $V_{CM}$, a pair of complementary differential mode sources 65, and a differential source impedance represented by resistor $R_S$. The input signals are coupled to a monitoring circuit 66 and input termination resistors 68 and 70. The monitoring circuit 66 detects the input DC common mode voltage $V_{CM}$ of the signal source and generates an output signal $V_I$ representative of the combination of the input DC common mode voltage $V_{CM}$ and a voltage representative of an internal termination voltage $V_{TERM}$. The monitoring circuit 66 has resistive elements 72 and 74 that present a high impedance to the input DC common mode voltage $V_{CM}$ relative to the effective input termination resistances. In the preferred embodiment the resistive elements 72 and 74 have resistive values of approximately 5000 ohms. The resistive elements 72 and 74 form a voltage divider network between the inputs 62 and 64. The common node 76 of the voltage divider network provides the output voltage $V_I$ that is coupled through a buffer amplifier 78 to a control circuit 80. The internal termination voltage generator 61 receives digital data from the measurement instrument 40 for generating an internal termination voltage $V_{TERM}$. The internal termination voltage output $V_{TERM}$ from the internal termination voltage generator 61 is coupled to the control circuit 80.

The input termination resistors 68 and 70 have a common node 82 that receives a scaled termination voltage $V_T$ and drive current $I_T$ from the control circuit 80. Each input termination resistor 68 and 70 is coupled to one of the input nodes 83 of attenuators 84 and 86 with each attenuator being coupled in parallel with one of the input termination resistors 68 and 70. Each attenuator has series coupled attenuation resistors 92 and 94 with the output node 96 between the resistors 92 and 94 coupled to one of the inputs of the differential amplifier 88. The attenuators 84 and 86 have a common node 90 that receives a scaled compensation voltage $V_A$ and drive current $I_A$ from the control circuit 80. The control circuit 80 generates the scaled termination voltage $V_T$ and drive current $I_T$ and scaled compensation voltage $V_A$ and drive current $I_A$ that are a function of the generated internal termination voltage $V_{TERM}$ and the input DC common mode voltage $V_{CM}$.

The input differential termination and attenuation network 60 having an internal common mode termination voltage generator 61 of the present invention operates to null the DC currents at the inputs 62 and 64 when the input DC common mode voltage $V_{CM}$ equals the internal termination voltage $V_{TERM}$ and the input source resistances are matched. Further, the present invention sets the DC common mode voltage at the output nodes 96 of the attenuators 84, 86 to optimize the dynamic range of the amplifier 88 for differing levels of the DC common mode voltage $V_{CM}$ and the internal termination voltage $V_{TERM}$. The scaled termination voltage $V_T$ and drive current $I_T$ in conjunction with the scaled compensation voltage $V_A$ and drive current $I_A$ generate DC currents through the termination resistors 68 and 70 and the attenuators 84 and 86 to produce a voltage equivalent to the internal termination voltage $V_{TERM}$ at the effective termination resistance connected to input 62 and 64. The DC currents further produce a DC common mode voltage at the output nodes 96 of the attenuators 84 and 86 that optimizes the dynamic range of the differential amplifier 88. In the preferred embodiment of the invention, the DC common mode voltage at the outputs nodes 96 of the attenuators 84 and 86 is set to a substantially fixed zero volts which provides the optimum dynamic range for the differential amplifier 88. The generalized equations for the control circuit 80 to set the voltage representative of the termination voltage $V_{TERM}$ and set the DC common mode voltage at the output nodes 96 of the attenuators 84 and 86 for optimizing the differential amplifier dynamic range are as follows. The equation for the scaled termination voltage $V_T$ is:

$$V_T = A \times V_{TERM} + B \times (V_I - V_{TERM})$$

and the equation for the scaled compensation voltage $V_A$ is:

$$V_A = -C \times V_{TERM} - D \times (V_I - V_{TERM})$$

where A, B C and D are scalars that are a function of the resistive values of the input termination resistors 68, 70 and the attenuation resistors 92, 94. The equations are valid for the specific conditions of matched source impedance inputs and differential mode AC signals with a common mode DC component. Where the input DC common mode input voltage $V_{CM}$ and the internal termination voltage $V_{TERM}$ are equal, the $V_T$ and $V_A$ voltages are proportional to the internal termination voltage $V_{TERM}$ as represented by the equation terms $A \times V_{TERM}$ and $-C \times V_{TERM}$. Voltage difference variations between the input DC common mode input voltage $V_{CM}$ and the internal termination voltage $V_{TERM}$, may be corrected by adding correction factors to the $V_T$ and $V_A$ equations. The corrections factors are derived from the detection of the combination of the input DC common mode input voltage $V_{CM}$ and the voltage representative of the internal termination voltage $V_{TERM}$ using the monitoring circuit 66 and applying the output signal $V_I$ to the control circuit 80 to generate the equation correction terms $B \times (V_I - V_{TERM})$ and $-D \times (V_I - V_{TERM})$. The input differential termination and attenuation network 60 corrects for differences between the input DC common mode voltage $V_{CM}$ and the internal termination voltage $V_{TERM}$ by generating the scaled termination voltage $V_T$ and drive current $I_T$ and the scaled compensation voltage $V_A$ and drive current $I_A$ that drive the output nodes 96 of the attenuators 84 and 86 to a substantially fixed zero volt level for the optimum dynamic range of the differential amplifier 80.

In the preferred embodiment of the invention, the input differential termination and attenuation network 60 having the internal termination voltage generator 61 is optimally designed to receive the differential signal from an input source having a differential 50 ohm impedance and a DC common mode voltage $V_{CM}$. The input termination resistors 68, 70 have nominal resistive values of 66.7 ohms. The input termination resistors 68, 70 are in parallel with attenuation resistors 92, 94 having respective nominal resistive values of 120 and 80 ohms. The effective input resistance resulting from the input termination resistors 68, 70 in parallel with the attenuation resistors 92, 94 is 50 ohms to a common mode termination voltage $V_{TERM}$ for each side of the differential network. The attenuation factor for each of the attenuators 84, 86 is 2.5×. The effective input resistance and attenuation factor are but one implementation of the present invention and other effective input termination resistances and attenuation factors may be used without departing from the scope of the present invention.

The derivations of the scaled termination voltage $V_T$ and scaled compensation voltage $V_A$ are described below for matched 50 ohm source impedance inputs and differential mode AC signals with a common mode DC component. The desired DC voltages at the inputs 62 and 64 are represented by the equation:

$$IN+ = IN- = \frac{(V_{CM} + V_{TERM})}{2}$$

where IN+ and IN− are the common mode DC voltage components on the inputs 62 and 64, $V_{CM}$ is the common mode voltage applied through the 50 ohm source impedance to the inputs 62 and 64, and $V_{TERM}$ is the internal termination voltage generated by the internal termination voltage generator 61. The desired DC voltages on the inverting and non-inverting inputs of the differential amplifier 88 should be 0 volts DC to achieve the maximum dynamic range for the amplifier as represented by the equation:

$$INPUT+ = INPUT- = 0$$

The $V_T$ and $V_A$ voltages from the control circuit 80 are dependent on the $V_{CM}$ common mode voltage at the inputs 62 and 64 and can be solved to satisfy the above equations. For the case where $V_{CM} = V_{TERM}$, the voltages $V_T$ and $V_A$ are both proportional to $V_{TERM}$:

$$V_T = 1.5556 \times V_{TERM}$$

$$V_A = -0.6667 \times V_{TERM}$$

where 1.5556 and 0.6667 are proportional scalars that are a function of the values of the input termination resistors 68, 70 and the attenuation resistors 92, 94.

If the $V_T$ and $V_A$ voltages are scaled versions of $V_{TERM}$, then variations between the input DC common mode voltage signal $V_{CM}$ and the internal termination voltage $V_{TERM}$ at the inputs 62 and 64 represent the average voltage between input DC common mode voltage signal $V_{CM}$ and $V_{TERM}$ when the input source resistances match the termination resistance. However, the voltage inputs, INPUT+ and INPUT−, to the inverting and non-inverting nodes of the differential amplifier 88 are not held at zero volts as the input DC common mode voltage signal $V_{CM}$ varies, but ranges over an attenuated percentage of the $V_{CM}$ value as represented by the following equation:

$$INPUT+ = INPUT- = 0.2 \times (V_{CM} - V_{TERM})$$

The monitoring circuit 66 detects the combination of the input DC common mode voltage $V_{CM}$ and the voltage representative of the internal termination voltage $V_{TERM}$ and generates an output signal $V_I$ that is coupled to the control circuit 80 for adjusting the $V_T$ and $V_A$ voltages. For the case where the input signal is supplied by a 50 ohm source, the following relationship exists between the sensed voltage $V_I$ and the input common mode voltage $V_{CM}$:

$$V_I = \frac{V_{CM} + V_{TERM}}{2} \Rightarrow V_{CM} = 2 \times V_I - V_{TERM}$$

It is possible for the 2.5× attenuator to compensate for the $V_{CM}$ input by adding correction factors to the $V_T$ and $V_A$ voltages of the form:

$$\Delta V_T = 0.1111 \times (V_{CM} - V_{TERM})$$

$$\Delta V_A = -0.3333 \times (V_{CM} - V_{TERM})$$

where 0.1111 and 0.3333 are proportional scalars that are a function of the values of the input termination resistors 68, 70 and the attenuation resistors 92, 94. Using the above equation for the relationship between $V_{CM}$ and $V_I$, it can be seen that:

$$(V_{CM} - V_{TERM}) = 2 \times (V_I - V_{TERM})$$

Substituting the above expression into the correction factor terms $\Delta V_T$ and $\Delta V_A$, the scaled termination voltage $V_T$ and the scaled compensation voltage $V_A$ become:

$$V_T = 1.5556 \times V_{TERM} + 0.2222 \times (V_I - V_{TERM})$$

$$V_A = -0.6667 \times V_{TERM} - 0.6667 \times (V_I - V_{TERM})$$

Figure 4:
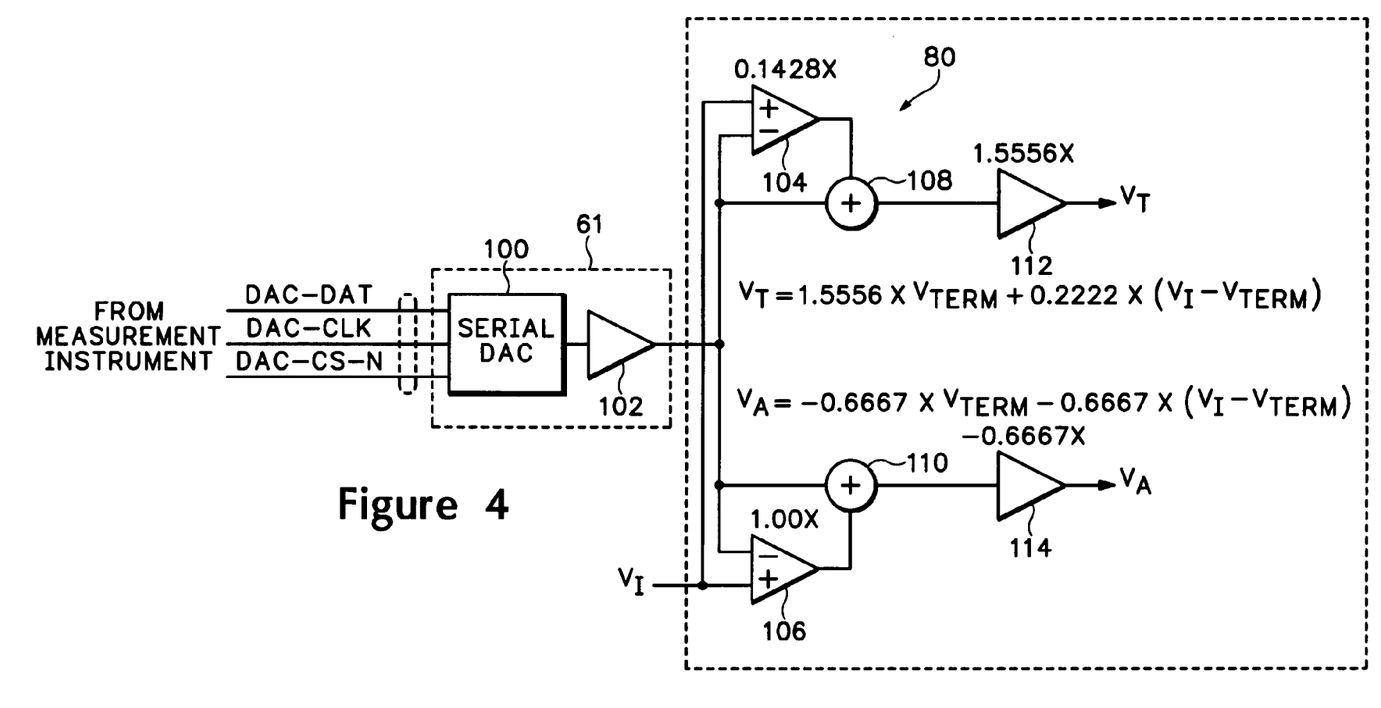
FIG. 4 is a functional schematic diagram of the control circuit and a first embodiment of the internal termination voltage generator in the input differential termination and attenuator network having an internal common mode termination voltage generator according to the present invention.

Referring to FIG. 4, there is shown a functional schematic diagram of the control circuit 80 of the input differential termination and attenuator network 60 and a first embodiment of the internal termination voltage generator 61. The internal termination voltage generator 61 is implemented using a serial digital-to-analog converter (DAC) 100. The serial DAC 100 is coupled to a serial bus receiving data DAC_DAT, clock DAC_CLK and enable DAC_CS_N signals from the measurement instrument 40. The serial DAC 100 internal register setting is clocked into the serial DAC 100 while the DAC_CS_N enable line is a logic LO state and then latched into the serial DAC 100 on the rising edge of the enable line. The analog internal termination voltage $V_{TERM}$ output from the serial DAC 100 is coupled through a buffer amplifier 102 to the minus inputs nodes of differential gain amplifiers 104 and 106 as well as summing nodes 108 and 110. The buffer amplifier 102 may include associated circuitry for providing gain and zero adjust. The output signal $V_I$ from the monitoring circuit 66 representing the combination of the input DC common mode voltage $V_{CM}$ and the internal termination voltage $V_{TERM}$ is coupled to the plus input nodes of the differential gain amplifiers 104 and 106. Differential gain amplifier 104 has a gain of 0.1428× and differential gain amplifier 106 has a gain of 1.00×. The output of differential gain amplifier 104 is 0.1428×($V_I$−$V_{TERM}$) which is applied to the summing node 108. The output of the summing node 108 is $V_{TERM}$+0.1428×($V_I$−$V_{TERM}$). The output of the summing node 108 is coupled to the input of driver amplifier 112 having a gain of 1.5556×. The output of the driver amplifier 112 is the scaled termination voltage $V_T$ having an output equal to $V_T = 1.5556 \times V_{TERM} + 0.2222 \times (V_I - V_{TERM})$ and the scaled termination voltage drive current $I_T$. The output of differential gain amplifier 106 is 1.00×($V_I$−$V_{TERM}$) which is applied to the summing node 110. The output of the summing node 110 is $V_{TERM}$+($V_I$−$V_{TERM}$). The output of the summing node 110 is coupled to the input of drive amplifier 114 having a gain of −0.6667×. The output of the drive amplifier 114 is the scaled compensation voltage $V_A$ having an output equal to $V_A=-0.6667 \times V_{TERM}-0.6667 \times (V_I-V_{TERM})$ and the scaled compensation voltage drive current $I_A$.

Figure 5:
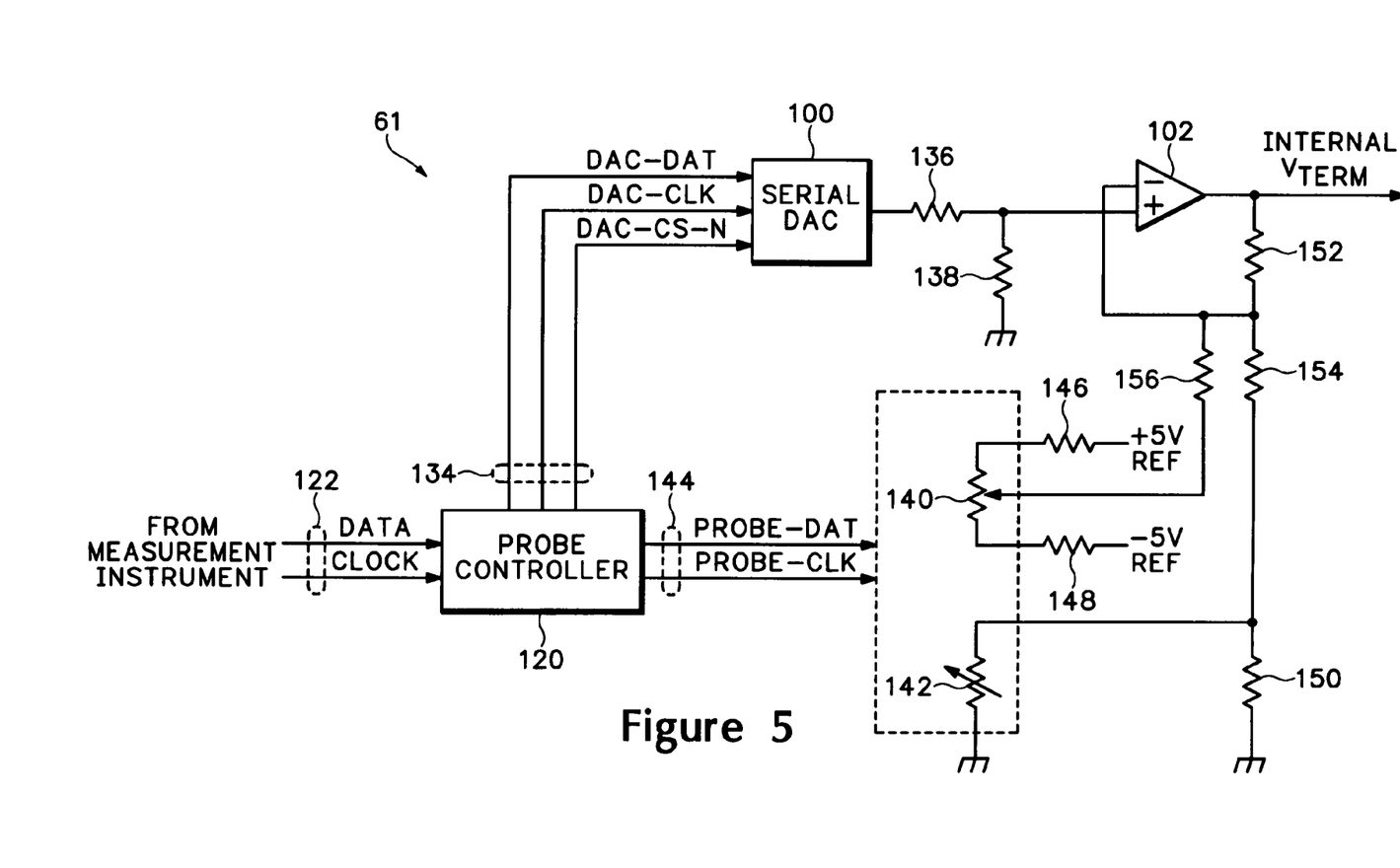
FIG. 5 is schematic representation of the preferred embodiment of the internal termination voltage generator according to the present invention.

Referring to FIG. 5, there is shown the preferred embodiment of the internal termination voltage generator 61. The internal termination voltage generator 61 includes a probe microcontroller 120 that receives data from the measurement instrument via a serial data bus 122. In the preferred embodiment, the serial data bus 122 is an I²C data bus. The data provided over the serial data bus 122 is generated in response to parameters set by the user using an internal termination voltage generator graphical user interface 123 as representatively shown in FIG. 6. The internal termination voltage generator graphical user interface 123 is generated on the display device 50 of the measurement instrument 40 by the user activating various pull-down menus and selecting the internal termination voltage generator interface 123. The user selects the measurement instrument input channel to which the differential measurement probe 44 probe is connected by selecting the appropriate channel in the CHANNEL BOX 124. The user may also select the overall amount of attenuation for the measurement probe by selecting the amount of attenuation in the ATTENUATION BOX 126. The source of the termination voltage $V_{TERM}$ is selected using the $V_{TERM}$ SOURCE BOX 128. The termination voltage $V_{TERM}$ may be selected from an external source, an internal source, or an automatic termination source. The termination voltage $V_{TERM}$ is set to internal source mode using the $V_{TERM}$ BOX 130. Once the parameters are set for the internal termination voltage generator 61, the internal termination voltage generator interface 123 is closed using the CLOSE BOX 132. The above parameter setting are by example only and additional parameter settings may be included with the internal termination voltage generator interface 123.

Figure 6:
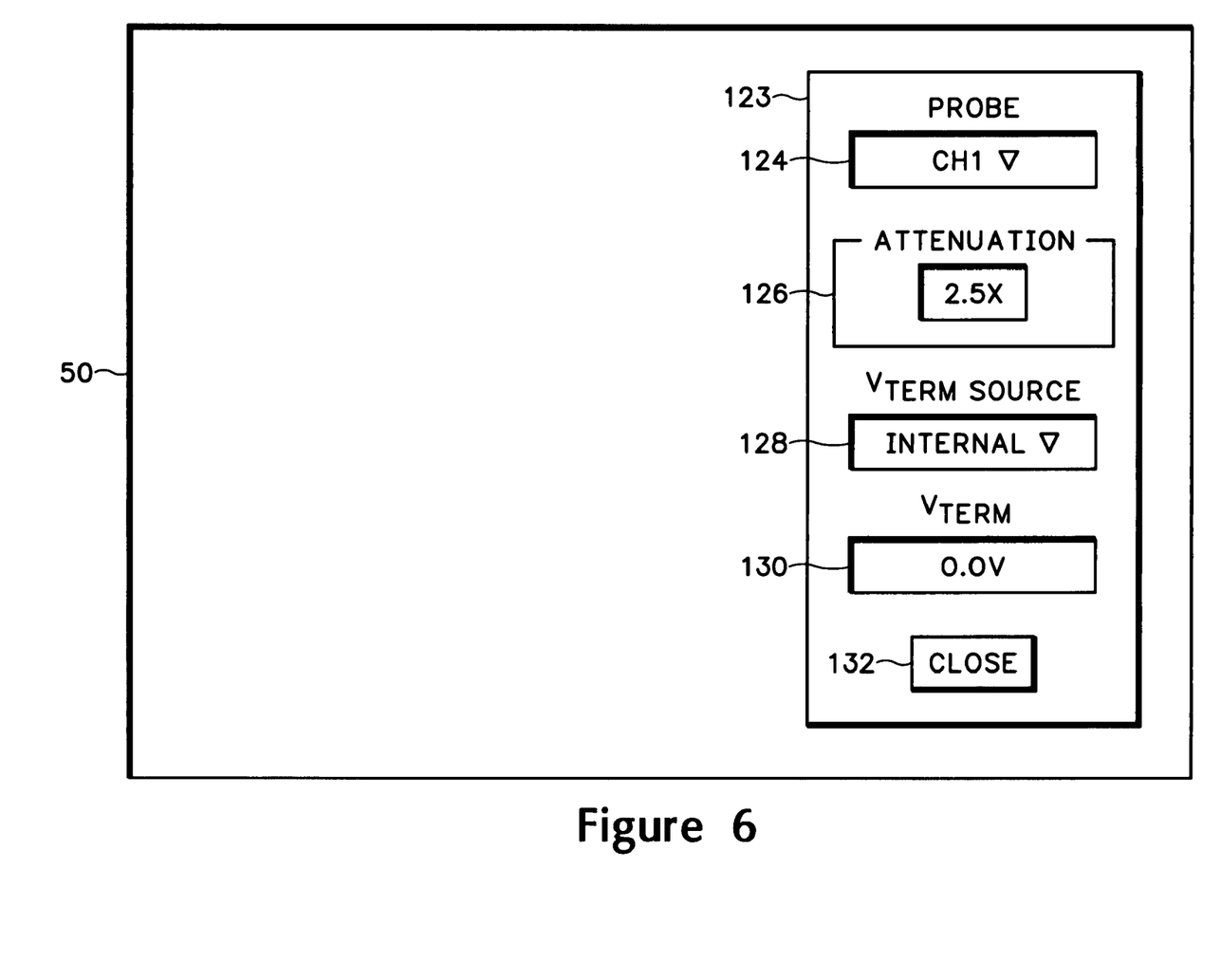
FIG. 6 is a representation of the internal termination voltage generator graphical user interface of the measurement instrument.

The measurement instrument 40 converts the parameters associated with the generation of the internal termination voltage $V_{TERM}$ into a serial data stream that is coupled via the measurement instrument/probe serial bus 122 to the differential measurement probe 44. The probe microcontroller 120 receives the serial data stream from the measurement instrument 40 and using internally stored commands, converts the termination voltage $V_{TERM}$ parameter into a serial data stream and enable signal that is coupled via a serial bus 134 to the serial DAC 100. As previously stated, the serial DAC 100 internal register setting is clocked into the serial DAC 100 while the DAC_CS_N enable line is a logic LO state and then latched into the serial DAC 100 on the rising edge of the enable line. The serial DAC 100 generates an analog output substantially equal to the $V_{TERM}$ voltage parameter set using the internal termination voltage generator graphical user interface 123.

The analog output from the serial DAC 100 is attenuated by a factor of four using a resistive divider network consisting of resistors 136 and 138. The buffer amplifier 102 offsets and scales the attenuated DAC output voltage using digital resistors 140 and 142. The digital resistors 140 and 142 receive internally stored offset and gain values from the probe microcontroller 120 via a serial data bus 144, such as an I²C serial bus. The offset and gain values are calculated and stored in the probe microcontroller memory during calibration of the differential measurement probe 44. The zero adjust resistor 140 is configured as a voltage adjustment with ±5V voltage references and 150 Kohm series resistors 146 and 148 connected to the ends of the 50 Kohm digital resistor 140. The zero adjust signal is coupled to the summing node of the buffer amplifier 102 with through resistor 156. The gain adjustment resistor 142 has a 50 Kohm resistance in parallel with resistor 150, one of the gain setting resistors of the buffer amplifier 102 consisting of resistors 142, 150, 152, and 154. The output of the buffer amplifier 102 is the internal termination voltage $V_{TERM}$ that is coupled to the control circuit 80.

Figure 7:
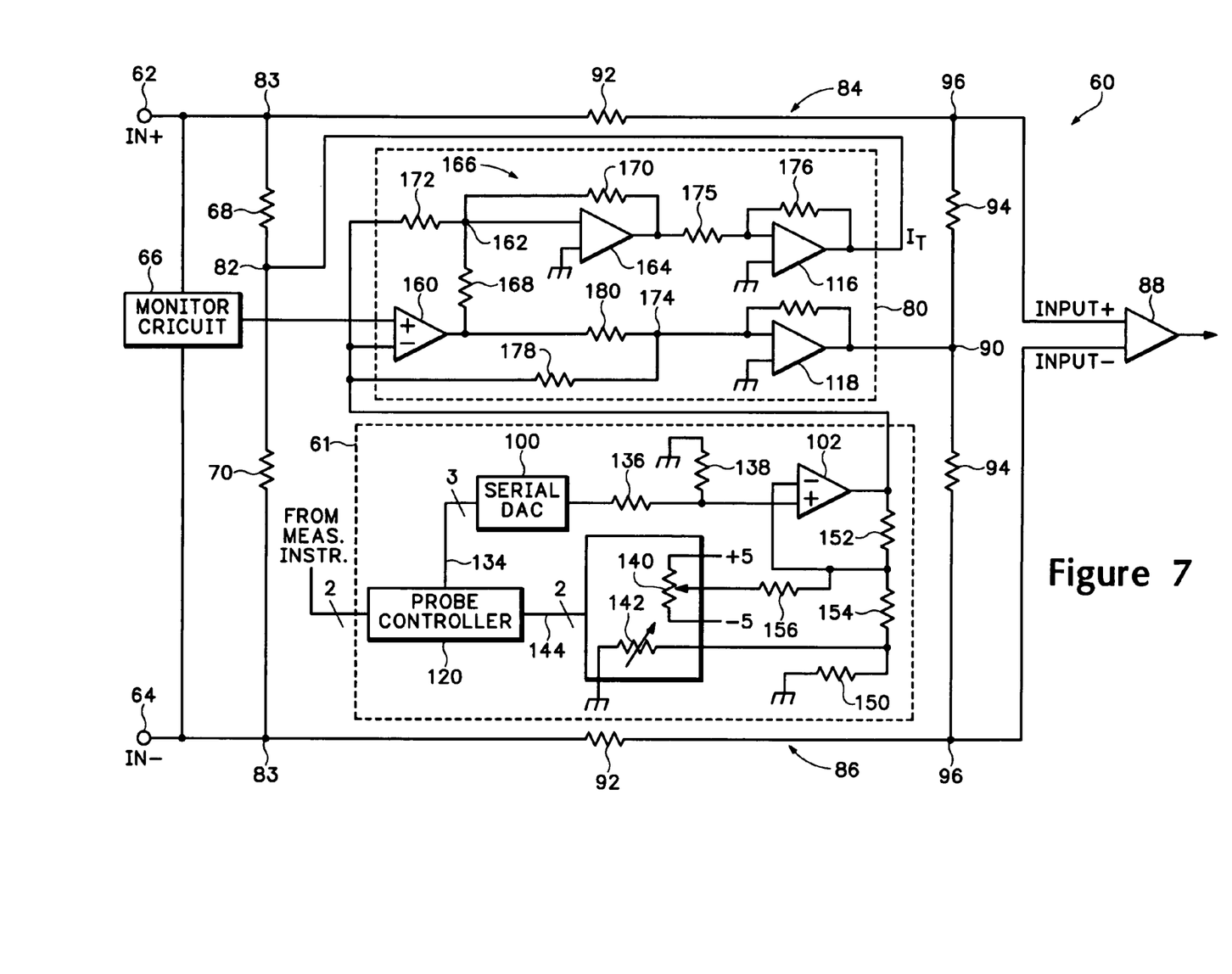
FIG. 7 is a schematic representation of the preferred embodiment of the input differential termination and attenuator network having an internal termination voltage generator according to the present invention.

Referring to FIG. 7, there is shown a schematic representation of the preferred embodiment of the input differential termination and attenuator network 60 having the internal common mode termination voltage generator 61 according to the present invention. Like elements from the previous drawing are labeled the same. The differential input signals, IN+, IN−, are coupled via the inputs 62 and 64 to the monitoring circuit 66 and the junction of the input termination resistors 68 and 70 with the input nodes 83 of their respective attenuator 84, 86. The differential input signals, IN+, IN−, are terminated by the effective termination resistances of the input termination resistors 68 and 70 in parallel with the attenuation resistors 92 and 94. The output nodes 96 between the attenuation resistors 92 and 94 are coupled to the inverting and non-inverting inputs of the differential amplifier 88. The monitoring circuit 66 output signal $V_I$, is coupled to the plus input of a 1× differential gain correction amplifier 160 in the control circuit 80. The minus input of the differential gain correction amplifier 160 receives the internal termination voltage $V_{TERM}$ from the internal termination voltage generator 61. The differential gain correction amplifier 160 generates an output voltage equal to $(V_I-V_{TERM})$. The $(V_I-V_{TERM})$ output voltage is coupled to input summing node 162 of summing amplifier 164 through an active attenuation circuit 166 consisting of attenuation resistors 168 and 170. The internal termination voltage $V_{TERM}$ is also coupled to the summing node 162 via resistor 172. The summing amplifier 164 generates an output voltage equal to $V_{TERM}+0.1428\times(V_I-V_{TERM})$ where the scalar term 0.1428 is a function of the attenuation factor of the attenuation circuit 166. The output of the summing amplifier 164 is coupled to the input of the $V_T$ drive amplifier 116. The voltage gain for the $V_T$ drive amplifier 116 is set by the resistors 175 and 176 that provides a 1.5556 scaling factor for generating a voltage output of $V_T=1.5556\times V_{TERM}+0.2222\times(V_I-V_{TERM})$ and a drive current $I_T$ which is coupled to the common node 82 of the termination resistors 68 and 70.

The internal termination voltage $V_{TERM}$ is further coupled to summing node 174 via resistor 178. The output of the differential gain correction amplifier 160 is also coupled to the summing node 174 via resistor 180 where resistors 178 and 180 have substantially the same resistive values. The input voltage to the summing node 174 has a value of $V_{TERM}+(V_I-V_{TERM})$ that is coupled to the input of the $V_A$ drive amplifier 118. A gain resistor 182 coupled across the $V_A$ driver amplifier 118 together with the summing node resistors 178 and 180 provides a −0.6667 scaling factor for generating an output voltage of $V_A=-0.6667\times V_{TERM}-0.6667\times(V_I-V_{TERM})$ and scaled compensation voltage drive current $I_A$ which is coupled to the common node 90 of the attenuators 84 and 86.

The above description was based on a matched 50 ohm source impedance. The DC common mode compensation described in this invention is also valid for other balanced input source impedance values. The below equations describe the compensation network topology voltages for three common source impedance cases. The AC-coupled source impedance case is effectively describing the result of an infinite DC source resistance. The below equations are shown in relation to the DC common mode voltage $V_{CM}$ instead of the term $(V_I-V_{TERM})$.

Zero Ohm Source Impedance $V_T = 1.3333 \times V_{TERM} + 0.2222 \times V_{CM}$ $V_A = -0.6667 \times V_{CM}$ $V_I = V_{CM}$ 50 Ohm Source Impedance $V_T = 1.4444 \times V_{TERM} + 0.1111 \times V_{CM}$ $V_A = -0.3333 \times V_{TERM} - 0.3333 \times V_{CM}$ $V_I = 0.5(V_{TERM} + V_{CM})$ AC-Coupled Source Impedance $V_T = 1.5556 \times V_{TERM}$ $V_A = 0.6667 \times V_{TERM}$ $V_I = V_{TERM}$ The input differential termination and attenuation network 60 having the internal common mode termination voltage generator 61 of the present invention has a response down to DC that allows for differential mode DC signals to be processed. In the case of an unbalanced, differential mode DC signal input $V_{DM}$ applied to the IN+ signal input 62 and zero volts applied to the IN− signal input 64, the input differential termination and attenuation network 60 still attempts to balance the common mode DC voltage at the differential amplifier 88 inputs. In the case of the differential mode DC signal just described, from a zero ohm source impedance, the resulting differential amplifier 88 input DC voltages are:

$INPUT+ = +0.2 \times V_{DM}$ $INPUT- = -0.2 \times V_{DM}$

The above equations show that the differential mode DC input has the correct 2.5× attenuation and has been level shifted to give a zero common mode signal at the inputs of the differential amplifier 88. Even for differential mode DC inputs, the input differential termination and attenuation network 60 attempts to maximize the dynamic range of the differential amplifier 88.

The above invention has been described in relation to a differential termination and attenuation network 60 having an effective 50 ohm termination and an attenuation factor of 2.5×. These particular parameters result in scalars A, B, C, and D of $V_T$ and $V_A$ being a specified value. The present invention may also be implemented for different effective differential termination values and different attenuation factors which would result in different scaling factors for $V_T$ and $V_A$. Further, the present invention is optimized for maximizing the dynamic range of the output differential amplifier 88. To achieve this parameter, the scaled compensation voltage $V_A$ is set to provide a substantially fixed zero volt DC common mode voltage to the inverting and non-inverting input of the differential amplifier 88.

A differential termination and attenuator network having an internal common mode termination voltage generator has been described having first and second input termination resistors coupled in parallel with corresponding resistive attenuator circuits. A monitoring circuit is coupled to input nodes of the network and generates an output signal representative of the combination of a DC common mode voltage on the input nodes and a voltage representative of an internal termination voltage. A control circuit receives the output signal from the monitoring circuit and the internal termination voltage and generates a scaled termination voltage and drive current and a scaled compensation voltage and drive current. The scaled termination voltage and drive current and the scaled compensation voltage and drive current provide DC currents through the input termination resistances and the attenuators for nulling DC currents at the network input nodes and provides a DC common mode voltage output from the first and second attenuators for optimizing the dynamic range of the differential measurement amplifier. The internal termination voltage generator received a serial data stream from a measurement instrument that sets the termination voltage output from the internal termination voltage generator.

It will be obvious to those having skill in the art that many changes may be made to the details of the above-described embodiments of this invention without departing from the underlying principles thereof. The scope of the present invention should, therefore, be determined only by the following claims.

What is claimed is:

1. A differential termination and attenuator network having an internal common mode termination voltage generator receiving a DC common mode voltage from a voltage source having source resistances and coupled to a differential amplifier comprising:

an internal common mode termination voltage generator receiving termination voltage parameters from an external source and generating an internal termination voltage;

first and second input termination resistances having a common node and respective input nodes receiving the DC common mode voltage from the voltage source;

first and second attenuators having a common node and respective input nodes and output nodes with each respective input node coupled to one of the first and second input termination resistances;

a monitoring circuit coupled to the input nodes of the first and second input termination resistances for generating an output signal representative of the combination of the DC common mode voltage on the input source resistances and a voltage representative of the internal termination voltage on the input termination resistances; and a control circuit receiving the internal termination voltage and the monitoring circuit output signal and generating a scaled termination voltage and drive current and a scaled compensation voltage and drive current that are a function of the internal termination voltage and the DC common mode voltage with the scaled termination voltage and drive current coupled to the common node of the first and second input termination resistances and the scaled compensation voltage and drive current coupled to the common node of the first and second attenuators for providing DC currents through the first input termination resistance and first attenuator and the second input termination resistance and second attenuator for nulling DC currents at the input nodes of the first and second input termination resistances and provides a DC common mode voltage at the output nodes of the first and second attenuators for optimizing the dynamic range of the differential amplifier.

2. The differential termination and attenuator network having an internal common mode termination voltage generator as recited in claim 1 wherein the monitoring circuit comprises a resistive voltage divider network having high impedance inputs relative to the first and second input termination resistances.

3. The differential termination and attenuator network having an internal common mode termination voltage generator as recited in claim 1 wherein the respective first and second input termination resistances further comprise respective first and second input termination resistors with the first input termination resistor coupled in parallel with the first attenuator and the second input termination resistor coupled in parallel with the second attenuator.

4. The differential termination and attenuator network having an internal common mode termination voltage generator as recited in claim 3 wherein each of the first and second attenuators comprise first and second resistors with one side of the first resistor coupled to one of the first and second input termination resistors and the other side coupled to one side of the second resistor at the output node of the attenuator and the other side of the second resistor coupled to receive the scaled compensation voltage and drive current at the common node of the first and second attenuators.

5. The differential termination and attenuator network having an internal common mode termination voltage generator as recited in claim 4 wherein the scaled termination and scaled compensation voltages have scaling factors that are a function of the first and second input termination resistors and the first and second resistors of the respective first and second attenuators.

6. The differential termination and attenuator network having an internal common mode termination voltage generator as recited in claim 5 wherein the scaled termination voltage has a first scaling factor providing a first voltage proportional to the internal termination voltage and a second scaling factor providing a correction voltage proportional to the difference between the DC common mode voltage on the input nodes of the first and second input termination resistances and the internal termination voltage.

7. The differential termination and attenuator network having an internal common mode termination voltage generator as recited in claim 5 wherein the scaled compensation voltage has a first scaling factor providing a first voltage proportional to the internal termination voltage and a second scaling factor providing a correction voltage proportional to the difference between the DC common mode voltage on the input nodes of the first and second input termination resistances and the internal termination voltage.

8. The differential termination and attenuator network having an internal common mode termination voltage generator as recited in claim 1 wherein the control circuit further comprises:
   a differential amplifier receiving the output signal from the monitoring circuit and the internal termination voltage and generating an output signal representative of the difference between the output signal from the monitoring circuit and the internal termination voltage;
   a first summing node coupled to receive the internal termination voltage and the output signal from the differential amplifier and generating an output signal representative of the internal termination voltage and an attenuated representation of the output signal from the differential amplifier;
   a second summing node coupled to receive the internal termination voltage and the output signal from the differential amplifier and generating an output signal representative of the internal termination voltage and the output signal from the differential amplifier;
   a first drive amplifier having a scaling gain factor and coupled to receive the output signal from the first summing node for generating the scaled termination voltage and drive current; and
   a second drive amplifier having a scaling gain factor and coupled to receive the output signal from the second summing node for generating the scaled compensation voltage and drive current.

9. The differential termination and attenuator network having an internal common mode termination voltage generator as recited in claim 8 wherein the first summing node comprises an active attenuation circuit receiving the output signal from the differential amplifier and a summing amplifier having an input node coupled to receive the internal termination voltage and coupled to an intermediate node of the attenuation circuit for receiving the attenuated representation of the output signal from the differential amplifier and generating the output signal representative of the internal termination voltage and the attenuated representation of the output signal from the differential amplifier.

10. The differential termination and attenuator network having an internal common mode termination voltage generator as recited in claim 1 wherein the scaled termination voltage and drive current and the scaled compensation voltage and drive current produce a substantially zero volts DC common mode voltage from the first and second attenuators.

11. The differential termination and attenuator network having an internal common mode termination voltage generator as recited in claim 1 wherein internal common mode termination voltage generator comprises a serial digital-to-analog converter.

12. The differential termination and attenuator network having an internal common mode termination voltage generator as recited in claim 1 wherein internal common mode termination voltage generator comprises:
   a microcontroller receiving the termination voltage parameters from an external source and generating a digital output representative of the internal termination voltage; and
   a digital-to-analog converter receiving the digital output representative of the internal termination voltage from the microcontroller and generating an analog internal termination voltage.

13. The differential termination and attenuator network having an internal common mode termination voltage generator as recited in claim 12 wherein internal common mode termination voltage generator further comprising a buffer amplifier coupled to receive the analog internal termination voltage and generating a zero-offset and scaled internal termination voltage.

* * * * *